US012229466B2

(12) United States Patent
Tung et al.

(10) Patent No.: US 12,229,466 B2
(45) Date of Patent: Feb. 18, 2025

(54) IMAGE DISPLAYING DEVICE

(71) Applicant: QISDA CORPORATION, Taoyuan (TW)

(72) Inventors: Hao-Chun Tung, Kinmen County (TW); Hsin-Che Hsieh, Taoyuan (TW); Wei-Jou Chen, Hsinchu County (TW); Po-Fu Wu, Taoyuan (TW); Yu-Fu Fan, Taoyuan (TW); Chih-Ming Chang, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 595 days.

(21) Appl. No.: 17/571,569

(22) Filed: Jan. 10, 2022

(65) Prior Publication Data
US 2022/0269467 A1 Aug. 25, 2022

(30) Foreign Application Priority Data
Feb. 23, 2021 (CN) .......................... 202110201890.2

(51) Int. Cl.
*G09G 5/10* (2006.01)
*G02B 15/14* (2006.01)
*G06F 3/14* (2006.01)
*G06T 3/18* (2024.01)
(Continued)

(52) U.S. Cl.
CPC ......... *G06F 3/1446* (2013.01); *G02B 15/143* (2019.08); *G06T 3/18* (2024.01); *G09G 3/03* (2020.08); *G09G 2300/026* (2013.01); *G09G 2354/00* (2013.01); *H05K 5/0017* (2013.01); *H05K 5/0021* (2013.01)

(58) Field of Classification Search
CPC ...... G06F 3/1446; G02B 15/143; G09G 5/10; G09G 3/03; G09G 2300/026; G09G 2354/00; G06T 3/18
USPC .......................................... 348/745; 345/691
See application file for complete search history.

(56) References Cited

U.S. PATENT DOCUMENTS 7,486,341 B2 *  2/2009  Hong ....................... G02B 3/14
                                                        349/95
8,264,772 B2 *  9/2012  Javidi ................... H04N 13/305
                                                         353/7
(Continued)

FOREIGN PATENT DOCUMENTS

CN      104575322 A      4/2015
CN      105607381 A      5/2016
CN      109633908 A      4/2019

*Primary Examiner* — Trang U Tran

(57) ABSTRACT

An image displaying device includes a planar display panel and a light penetrating unit. The planar display panel displays a plane image. The planar display panel at least includes a first pixel group, a second pixel group and a third pixel group. The second pixel group is located between the first pixel group and the third pixel group. When vision passes through the light penetrating unit toward the planar display panel, the vision acquires a second distance of a second imaging position within the plane image relevant to the second pixel group relative to the planar display panel being greater than a first distance of a first imaging position within the plane image relevant to the first pixel group relative to the planar display panel and a third distance of a third imaging position within the plane image relevant to the third pixel group relative to the planar display panel.

2 Claims, 11 Drawing Sheets

(51) Int. Cl.
 _G09G 3/00_ (2006.01)
 _H05K 5/00_ (2006.01)

(56) References Cited

U.S. PATENT DOCUMENTS

| | | | | |
|---|---|---|---|---|
| 8,848,043 | B2* | 9/2014 | Lin | H04N 13/324 |
| | | | | 348/54 |
| 11,522,143 | B2* | 12/2022 | Ju | H01L 24/32 |
| 11,825,688 | B2* | 11/2023 | Ahn | H10K 71/00 |
| 2006/0215018 | A1* | 9/2006 | Fukushima | H04N 13/31 |
| | | | | 348/51 |
| 2013/0088532 | A1* | 4/2013 | Shin | H04N 13/356 |
| | | | | 345/691 |

* cited by examiner

IMAGE DISPLAYING DEVICE

BACKGROUND OF THE INVENTION

1. Field of the Invention

The present invention relates to an image displaying device, and more particularly, to an image displaying device capable of showing curved displaying efficiency via a planar display panel.

2. Description of the Prior Art

A conventional image displaying device includes a planar display and a curved display. The planar display has a small size, but provides worse vision experience due to the displayed planar image. The curved display provides preferred vision experience because of the displayed curved image, but has drawbacks of a huge size and expensive cost. Thus, design of an image displaying device of showing curved displaying efficiency without specific optical membranes and having advantages of the small size and low manufacturing cost is an important issue in the display industry.

SUMMARY OF THE INVENTION

The present invention provides curved displaying efficiency for solving above drawbacks.

According to the claimed invention, an image displaying device includes a planar display panel and a light penetrating unit. The planar display panel is adapted to display a plane image. The planar display panel at least includes a first pixel group, a second pixel group and a third pixel group. The second pixel group is located between the first pixel group and the third pixel group. The light penetrating unit is disposed before the planar display panel. When vision passes through the light penetrating unit toward the planar display panel, the vision acquires that a second distance of a second imaging position within the plane image relevant to the second pixel group relative to the planar display panel is greater than a first distance of a first imaging position within the plane image relevant to the first pixel group relative to the planar display panel and a third distance of a third imaging position within the plane image relevant to the third pixel group relative to the planar display panel.

According to the claimed invention, density of the second pixel group is greater than density of the first pixel group and the third pixel group. A focal length of the light penetrating unit relevant to the first pixel group is the same as a focal length of the light penetrating unit relevant to the second pixel group and a focal length of the light penetrating unit relevant to the third pixel group.

According to the claimed invention, the light penetrating unit is an optical lens module having a plurality of lens units. The plurality of lens units at least includes a first lens group, a second lens group and a third lens group respectively aligning with the first pixel group, the second pixel group and the third pixel group. A focal length of the second lens group is different from a focal length of the first lens group and a focal length of the third lens group.

According to the claimed invention, the image displaying device further includes a curved display panel and an operation processor. The curved display panel is disposed adjacent to the planar display panel and adapted to display a curved image. The operation processor is electrically connected to the curved display panel and the planar display panel. The operation processor is adapted to distort the plane image in accordance with standards of the planar display panel and the curved display panel. The vision watches a combination of the curved image and the distorted plane image to show curved displaying efficiency when the vision focuses on the curved display panel and the planar display panel.

According to the claimed invention, the image displaying device further includes a first display panel and a second display panel. The first display panel is disposed on a side of the planar display panel. The second display panel is disposed on the other side of the planar display panel opposite to the first display panel. When the vision watches the first display panel and the second display panel and passes through the light penetrating unit toward the planar display panel, the vision acquires a distance of an imaging position of the planar display panel relative to the image displaying device is greater than each of two distances of two imaging positions of the first display panel and the second display panel respectively relative to the image displaying device.

The image displaying device of the present invention can provide several embodiments to show the curved displaying efficiency via the planar display, and have advantages of simple structure and low manufacturing cost. The first embodiment can divide the specific-designed planar display panel into several pixel groups along the specific direction, and the pixel distribution density of one pixel group can be different from the pixel distribution density of other pixel groups. The second embodiment can have the planar display panel with the uniform pixel distribution density, and the specific-designed optical lens module can be disposed before the planar display panel; the optical lens module can have the plurality of lens units, and the central lens group has the longest focal length, and the focal length of other lens groups can be gradually decreased from the center to the side of the plurality of lens units. The third embodiment can utilize the software compensation to adjust all partitions of the plane image via different distortion. The fourth embodiment can dispose the plane-concave lens or the convex lens before the planar display. The fifth embodiment can dispose the plane-concave lens or the convex lens before at least one of the planar display and the curved display.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
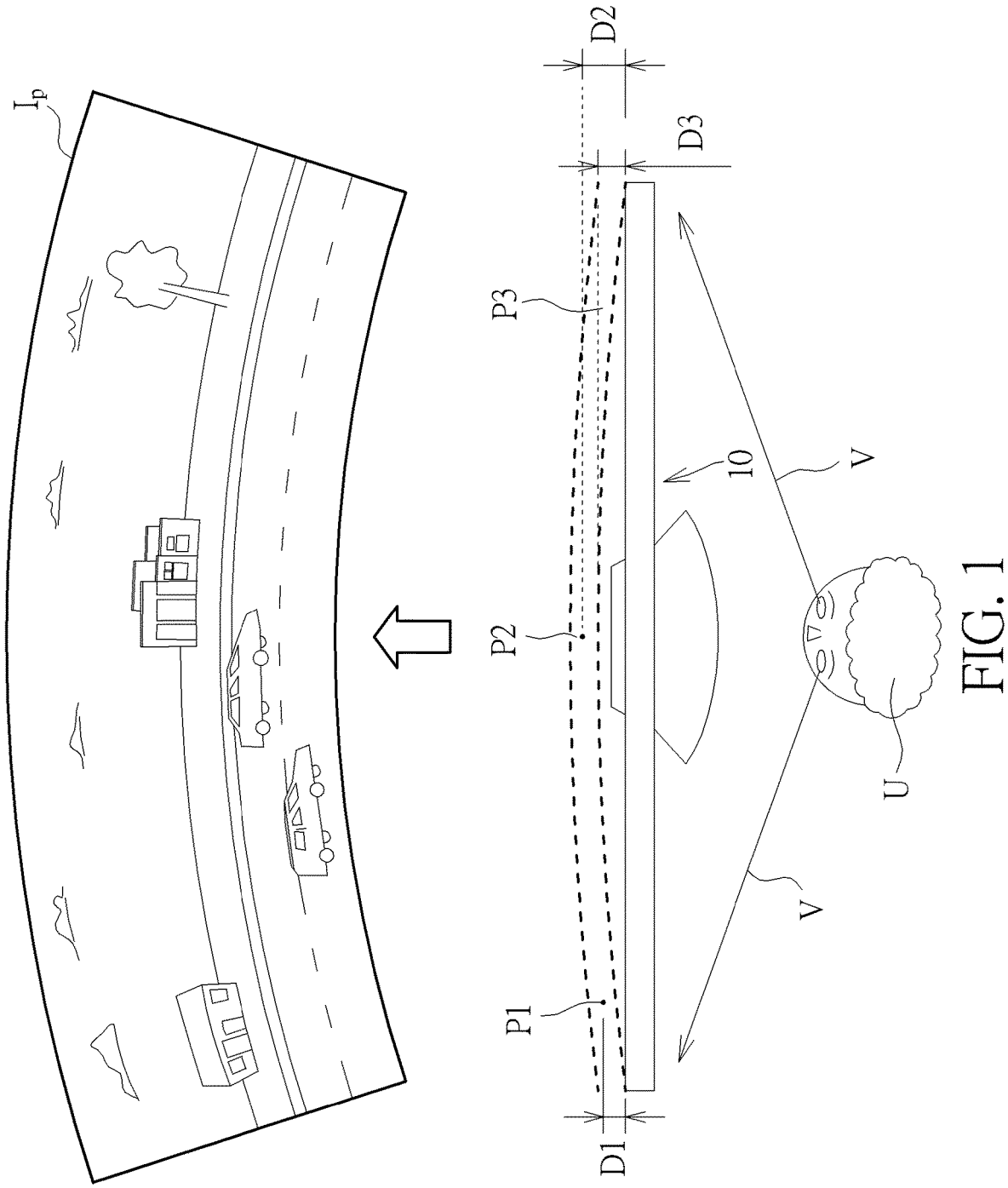
FIG. 1 is a diagram of an image displaying device according to an embodiment of the present invention.
Figure 2:
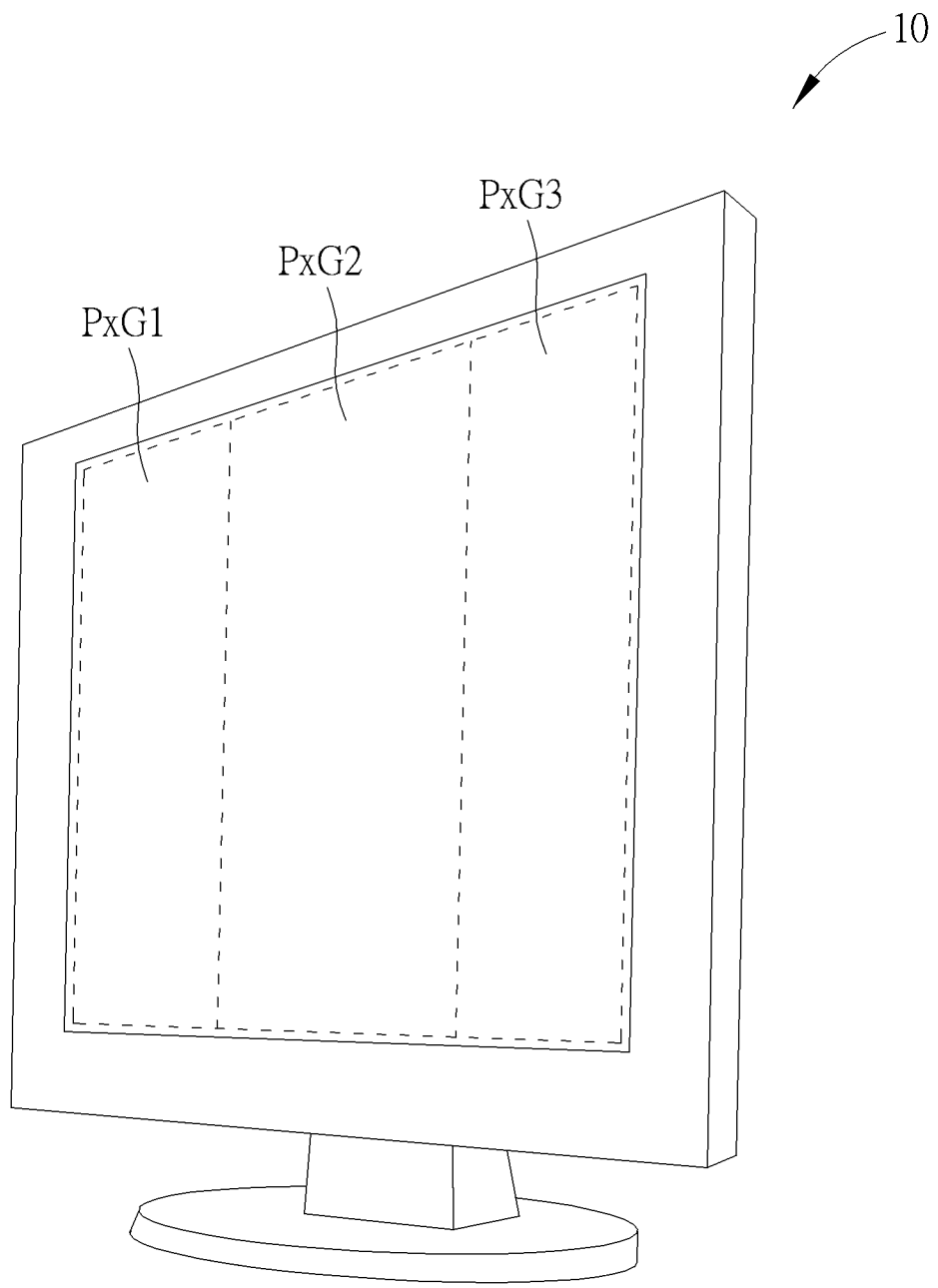
FIG. 2 is an assembly diagram of the image displaying device according to the embodiment of the present invention.
Figure 3:
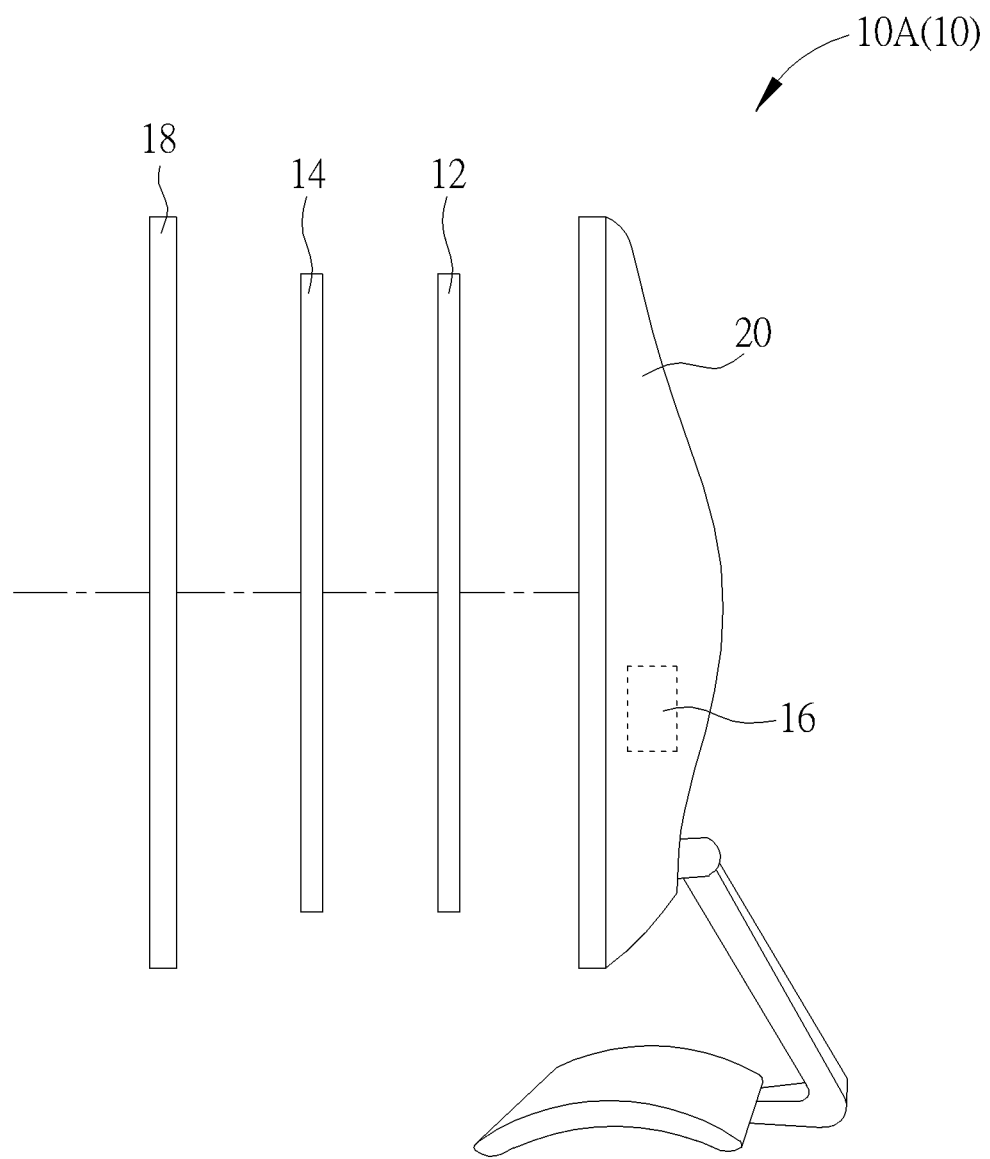
FIG. 3 is an exploded diagram of the image displaying device according to a first embodiment of the present invention.

Please refer to FIG. 1 to FIG. 3. FIG. 1 is a diagram of an image displaying device 10 according to an embodiment of the present invention. FIG. 2 is an assembly diagram of the image displaying device 10 according to the embodiment of the present invention. FIG. 3 is an exploded diagram of the image displaying device 10A according to a first embodiment of the present invention. The image displaying device 10A can include a planar display panel 12, a light penetrating unit 14 and an operation processor 16. The planar display panel 12 may include optical members, such as a glass substrate, a polarization plate, a filtering plate and a diffusing plate, and may further include electronic components, such as a printed circuit board and a backlight module. A category, a number and an arrangement of the optical members and the electronic components are set in accordance with a design demand of the planar display panel 12, and a detailed description is omitted herein for simplicity. The operation processor 16 can analyze data of the original image, and utilize the planar display panel 12 to display a plane image Ip. The light penetrating unit 14 can be disposed on a front end of the planar display panel 12; that is to say, the present invention may use a front frame 18 to dispose the planar display panel 12 and the light penetrating unit 14 on a base 20 of the image displaying device 10A.

The planar display panel 12 can be divided into several pixel groups along a lateral direction. For example, the planar display panel 12 may at least include a first pixel group PxG1, a second pixel group PxG2 and a third pixel group PxG3. The second pixel group PxG2 can be located between the first pixel group PxG1 and the third pixel group PxG3. An optical feature of the light penetrating unit 14 can be varied in accordance with embodiments of the planar display panel 12. In the first embodiment, the light penetrating unit 14 can be passed through by a light beam, and cannot scatter or condense the light beam. Distribution density of the second pixel group PxG2 can be greater than distribution density of the first pixel group PxG1 and distribution density of the third pixel group PxG3. A focal length of the light penetrating unit 14 relevant to the first pixel group PxG1 can be the same as a focal length of the light penetrating unit 14 relevant to the second pixel group PxG2 and a focal length of the light penetrating unit 14 relevant to the third pixel group PxG3.

In the first embodiment, the light penetrating unit 14 can be a transparent plane surface glass which provides waterproof and dustproof protection, or any optical component with the same or similar functions, and the detailed description is omitted herein for simplicity. Generally, the pixel distribution density can be gradually decreased from a central area (which means the second pixel group PxG2) to two lateral areas (which mean the first pixel group PxG1 and the third pixel group PxG3) of the planar display panel 12; therefore, when the plane image Ip is displayed on the planar display panel 12 and vision V passes through the light penetrating unit 14 toward the planar display panel 12, the vision V can acquire that a second distance D2 of a second imaging position P2 within the plane image Ip relevant to the second pixel group PxG2 relative to the planar display panel 12 is greater than a first distance D1 of a first imaging position P1 within the plane image Ip relevant to the first pixel group PxG1 relative to the planar display panel 12 and a third distance D3 of a third imaging position P3 within the plane image Ip relevant to the third pixel group PxG3 relative to the planar display panel 12, which means the planar display panel 12 of the image displaying device 10A can show curved displaying efficiency.

Figure 4:
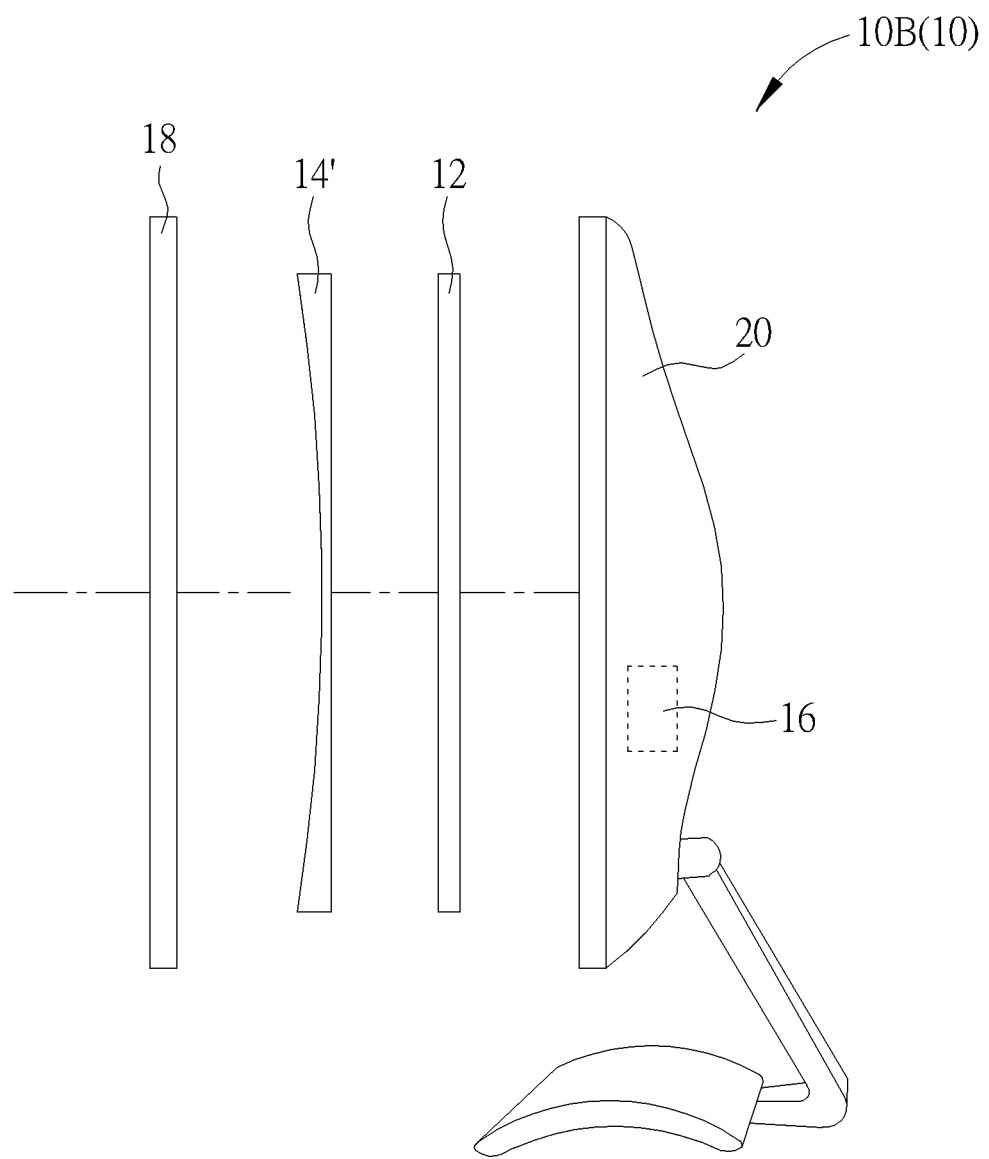
FIG. 4 is an exploded diagram of the image displaying device according to a second embodiment of the present invention.
Figure 5:
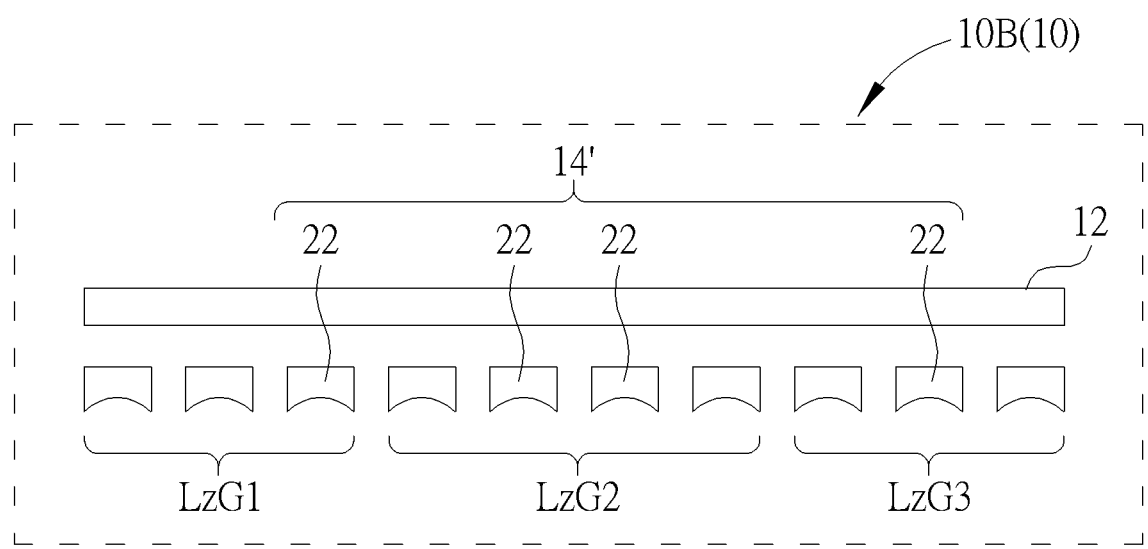
FIG. 5 is a diagram of the image displaying device in another view according to the second embodiment of the present invention.

Please refer to FIG. 1, FIG. 2, FIG. 4 and FIG. 5. FIG. 4 is an exploded diagram of the image displaying device 10B according to a second embodiment of the present invention. FIG. 5 is a diagram of the image displaying device 10B in another view according to the second embodiment of the present invention. The image displaying device 10B can include a planar display panel 12, a light penetrating unit 14' and an operation processor 16. In each embodiment of the present invention, elements having the same numerals as ones of the above-mentioned embodiment have the same structures and functions, and the detailed description is omitted herein for simplicity. The light penetrating unit 14' of the second embodiment can be an optical lens module which includes a plurality of lens units 22, and the plurality of lens units 22 can be divided into several lens groups along the lateral direction. For example, the plurality of lens units 22 can at least include a first lens group LzG1, a second lens group LzG2 and a third lens group LzG3 respectively aligning with the first pixel group PxG1, the second pixel group PxG2 and the third pixel group PxG3.

In the second embodiment, the distribution density of the second pixel group PxG2 can be the same as or similar to the distribution density of the first pixel group PxG1 and the distribution density of the third pixel group PxG3, and the focal length of the second lens group LzG2 can be greater than the focal length of the first lens group LzG1 and the focal length of the third lens group LzG3. Thus, the vision V can acquire the second distance D2 of the second imaging position P2 within the plane image Ip via the second pixel group LzG2 relative to the planar display panel 12 can be greater than the first distance D1 of the first imaging position P1 within the plane image Ip via the first pixel group LzG1 relative to the planar display panel 12 and the third distance D3 of the third imaging position P3 within the plane image Ip via the third pixel group LzG3 relative to the planar display panel 12, so that the planar display panel 12 of the image displaying device 10B can show curved displaying efficiency.

If the lens unit 22 has more than three lens groups, the lens group which is located on a center of the light penetrating unit 14' can have the largest focal length, and the related imaging position can be set on the farthest position; the focal length of the lens groups which are distributed from the center to two sides of the light penetrating unit 14' can be gradually decreased, and the related imaging positions can be gradually close to the planar display panel 12. An actual application of distribution of the lens groups is not limited to the above-mentioned embodiment. For example, in other possible embodiments, the first lens group LzG1, the second lens group LzG2 and the third lens group LzG3 can respectively include a plurality of zoomable lens units 22; the operation processor 16 can adjust the focal length of one or some of the lens groups inside the light penetrating unit 14' in accordance with an actual demand, so as to adjust at least one of a distortion amplitude and a distortion direction of the curved displaying efficiency. Besides, each lens unit 22 of the light penetrating unit 14' can be a plane-concave lens or a convex lens, and a plane surface or a convex surface of the light penetrating unit 14' can face toward the planar display panel 12. All the lens units 22 of the light penetrating unit 14' can preferably be the same type; the lens unit 22 shown in FIG. 5 can be the plane-concave lens, and may be optionally replaced by the convex lens (which is not shown in the figures).

Figure 6:
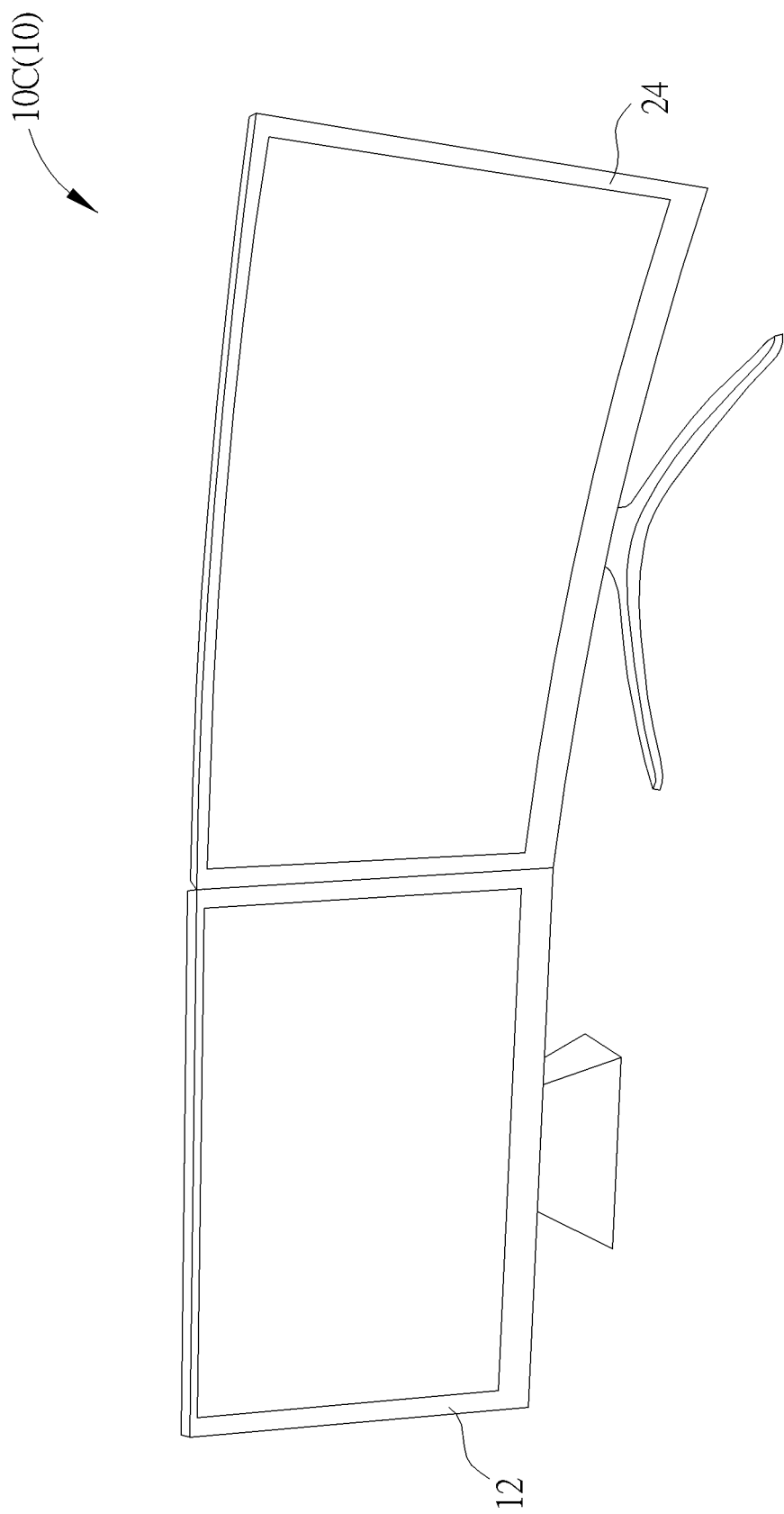
FIG. 6 is a diagram of the image displaying device according to a third embodiment of the present invention.
Figure 7:
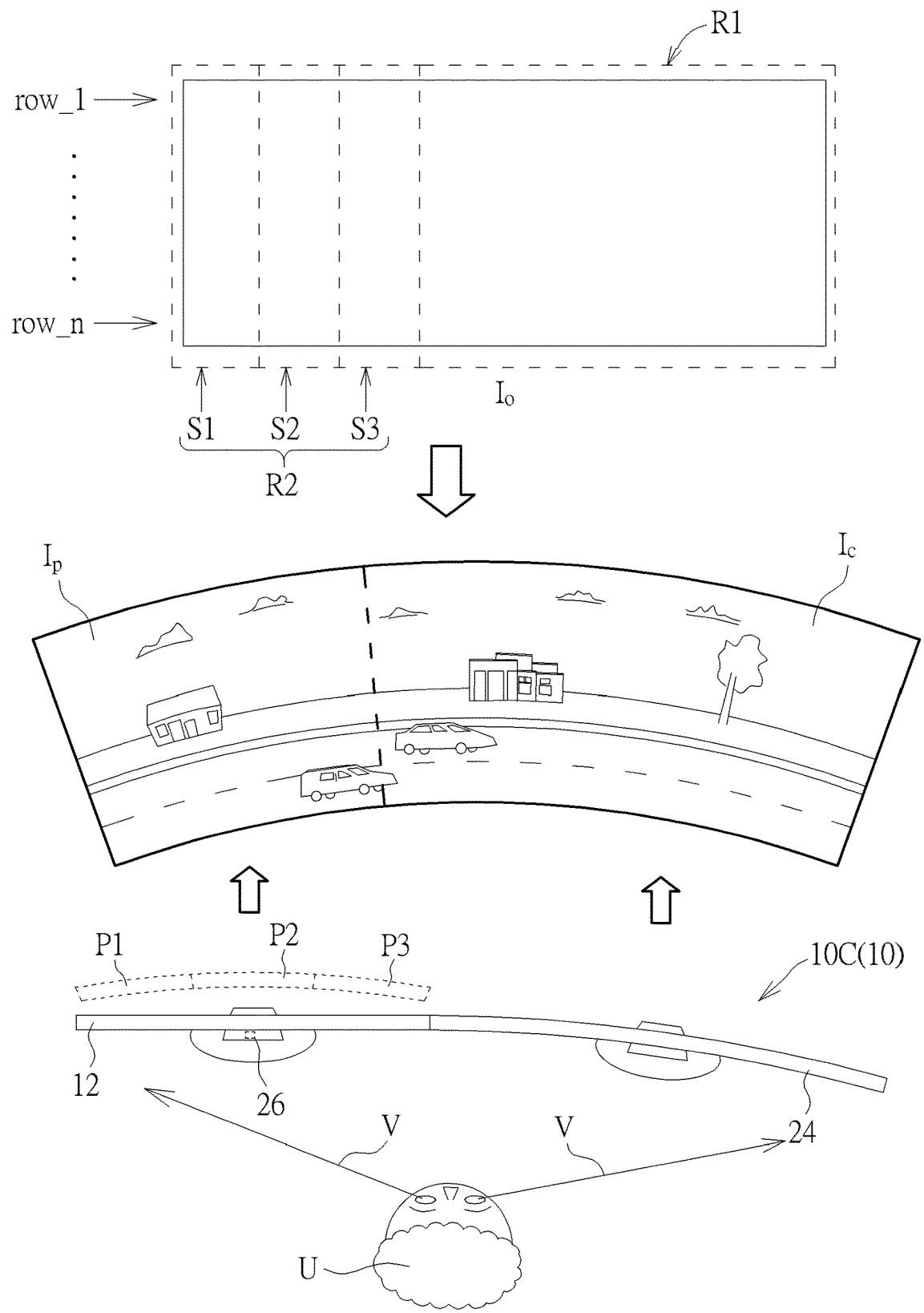
FIG. 7 is a diagram of an original image acquired from the image displaying device according to the third embodiment of the present invention.

Please refer to FIG. 1, FIG. 2, FIG. 6 and FIG. 7. FIG. 6 is a diagram of the image displaying device 10C according to a third embodiment of the present invention. FIG. 7 is a diagram of an original image Io acquired from the image displaying device 10C according to the third embodiment of the present invention. The image displaying device 10C can include a planar display panel 12, a light penetrating unit 14, an operation processor 16 and a curved display panel 24. A casing whereon the planar display panel 12 is disposed can cover the light penetrating unit 14 and the operation processor 16, which are not shown in the image displaying device 10C shown in FIG. 6 and FIG. 7. The curved display panel 24 can be disposed adjacent to the planar display panel 12 in a touchable manner or in an untouchable manner, and used to show a curved image Ic. The operation processor 16 can be electrically connected to the planar display panel 12 and the curved display panel 24 for acquiring its standards and parameter. The operation processor 16 can distort the plane image Ip on the planar display panel 12 in accordance with standards of the curved display panel 24; when the vision V simultaneously watches the curved display panel 24 and the planar display panel 12, the curved image Ic and the distorted plane image Ip can be combined to show the curved displaying efficiency.

The operation processor 16 can acquire the original image Io, and divide the original image Io into a first area R1 and a second area R2 in accordance with standards of the curved display panel 24 and the planar display panel 12. The first area R1 can be represented as the curved image Ic directly showed on the curved display panel 24. The second area R2 can be distorted and showed on the planar display panel 12. For example, if the curved display panel 24 is the 32-inch curved display and the planar display panel 12 is the 22-inch planar display, the curved display panel 24 and the planar display panel 12 have the same or similar height, and a width of the curved display panel 24 is two times a width of the planar display panel 12; in the meantime, the operation processor 16 can define two third of the original image Io as the first area R1 an further define one third of the original image Io as the second area R2 along the lateral direction; an actual application of division among the original image Io is not limited to the above-mentioned embodiment, which depends on the design demand.

In the third embodiment, the operation processor 16 can further divide the second area R2 of the original image Io into several partitions along a specific direction (such as the lateral direction), and utilize different distortion to adjust image data of each partition; for example, the central partition has largest distortion, and distortion of other partitions can be gradually decreased from the center to the side of the second area R2. Distortion of each partition can be varied in accordance with the image curvature of the curved image Ic, so that the curved displaying efficiency performed by the distorted plane image Ip can be matched with the curved image Ic. The foresaid distortion may represent lateral deformation of each partition; however, deformed direction is not limited to the above-mentioned embodiment, and depends on the actual demand. For example, the second area R2 may be at least divided into a first partition S1, a second partition S2 and a third partition S3. Distortion of the second area R2 can be greater than distortion of the first partition S1 and the third partition S3. Therefore, the vision V can acquire that the second distance D2 of the second imaging position P2 generated by the second partition S2 can be greater than the first distance D1 of the first imaging position P1 generated by the first partition S1, and the third distance D3 of the third imaging position P3 generated by the third partition S3.

As the embodiment shown in FIG. 7, the present invention can directly divide the second area R2 of the original image Io into several partitions along the lateral direction; however, in other possible embodiments, a plurality of image datum rows row_1~n can be defined inside the second area R2 (which means a range of the plane image Ip) along a vertical direction, and then each of the plurality of image datum rows row_1~n can be divided into several partitions along the lateral direction. A number and variation of the partitions within different image datum rows can be identical with each other, or be dissimilar from each other due to specific factors, and the curved displaying efficiency showed by the distorted plane image Ip can be preferably matched with the curved image Ic. For example, the image displaying device 10C can further include a tracking sensor 26 electrically connected to the operation processor 16 and facing a front of the image displaying device 10C. The tracking sensor 26 can track a relative position of the user U before the image displaying device 10C. The tracking sensor 26 may be a heat detector or an image detector, or other detectors with the same or similar functions. The operation processor 16 can adaptively adjust the first imaging position P1, the second imaging position P2 and the third imaging position P3 in accordance with the relative position of the user U, such as the second imaging position P2 being greater than the third imaging position P3 and the third imaging position P3 being greater than the first imaging position P1, so as to provide the preferred curved displaying efficiency.

In the third embodiment, the curved display panel 24 can be connected to the planar display panel 12 in a rotatable manner or in a detachable manner. The said rotatable application may be a rotary mechanism, a pin mechanism, or a movable engagement mechanism; the said detachable application may be a locking mechanism, a buckling mechanism or a magnetic mechanism. Variation of the rotatable application and the detachable application is not limited to the above-mentioned embodiments, which depends on the design demand.

Figure 8:
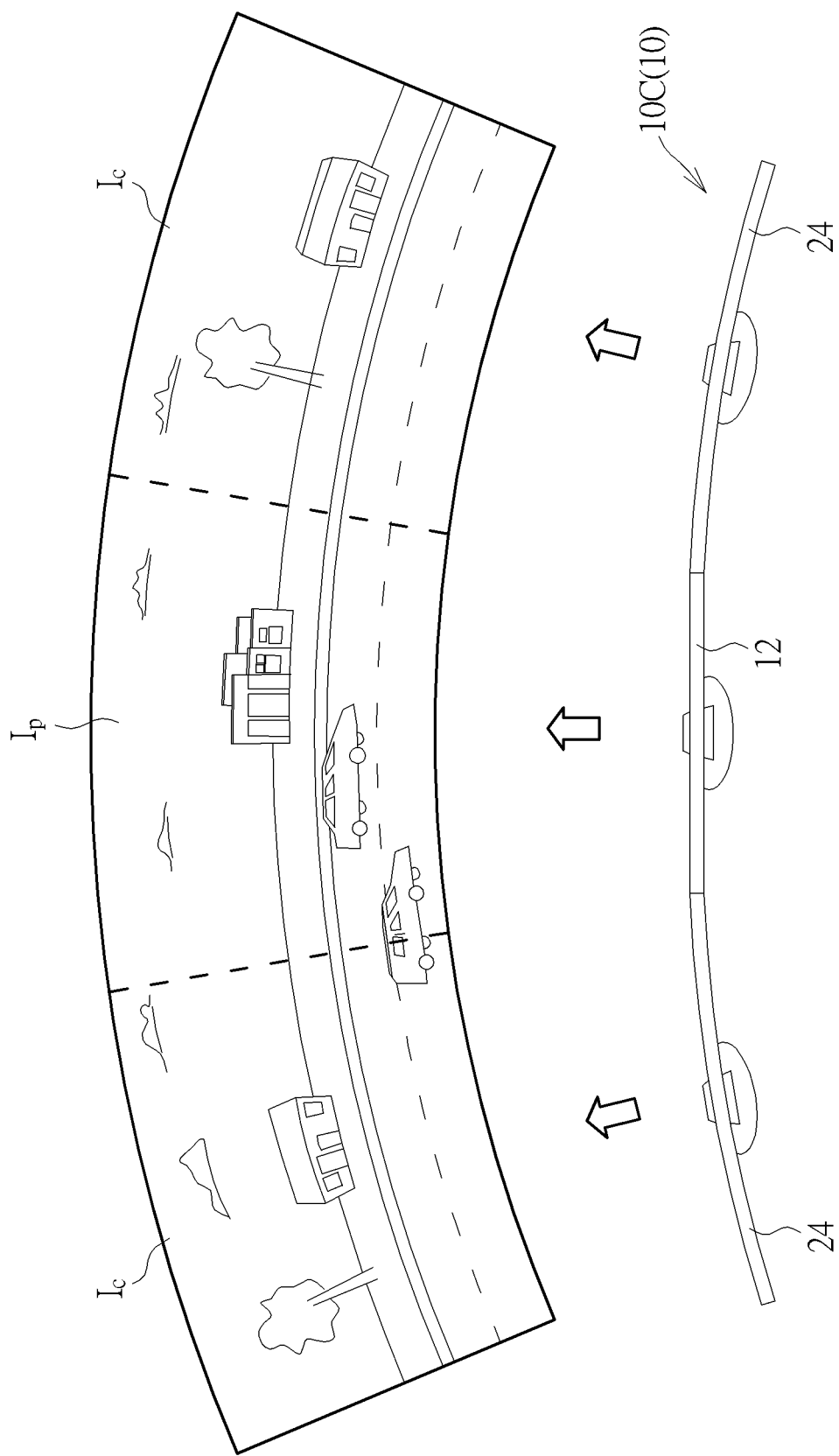
FIG. 8 is a diagram of the image displaying device in another type according to the third embodiment of the present invention.

Please refer to FIG. 8. FIG. 8 is a diagram of the image displaying device 10C in another type according to the third embodiment of the present invention. The image displaying device 10C can include one planar display panel 12 and two curved display panels 24. The two curved display panel 24 can be respectively disposed on two opposite sides of the planar display panel 12. The original image Io can be divided into three areas; the left-side area and the right-side area can be represented as the curved image Ic directly showed on the curved display panel 24, and the central area can be divided into several partitions via the operation processor 16. Each of the partitions can be distorted in accordance with standards of the curved display panel 24, so that the central area of the original image Io (which corresponds to the range of the plane image Ip) can be accurately distorted to match with the left-side curved image Ic and the right-side curved image Ic.

Figure 9:
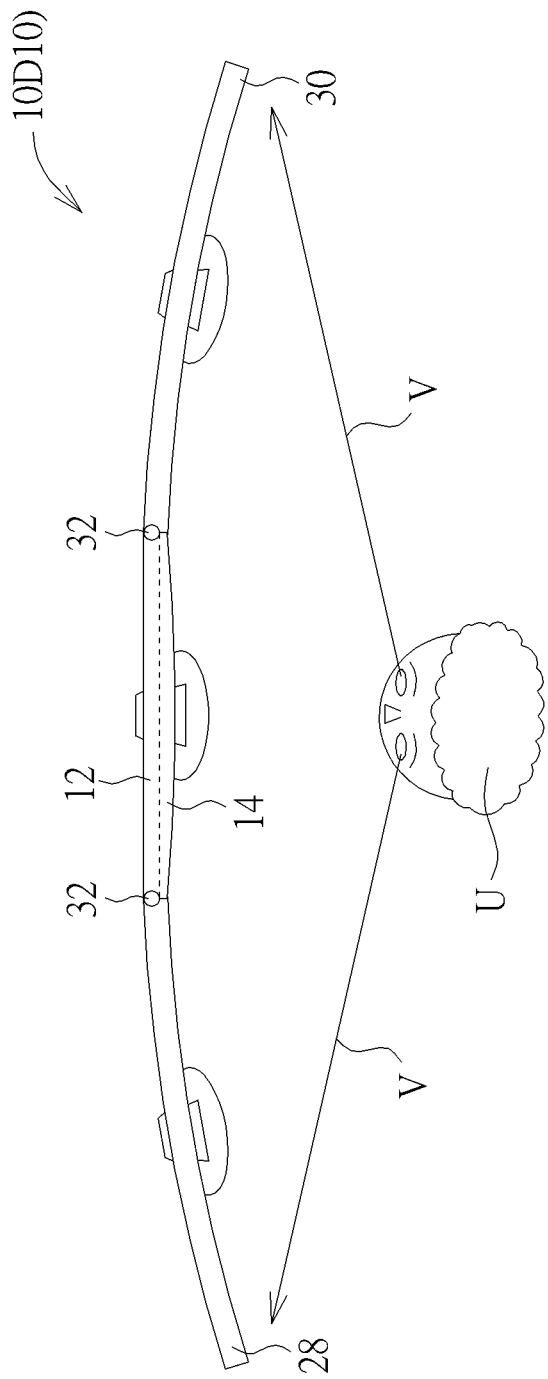
FIG. 9 is a diagram of the image displaying device according to a fourth embodiment of the present invention.
Figure 10:
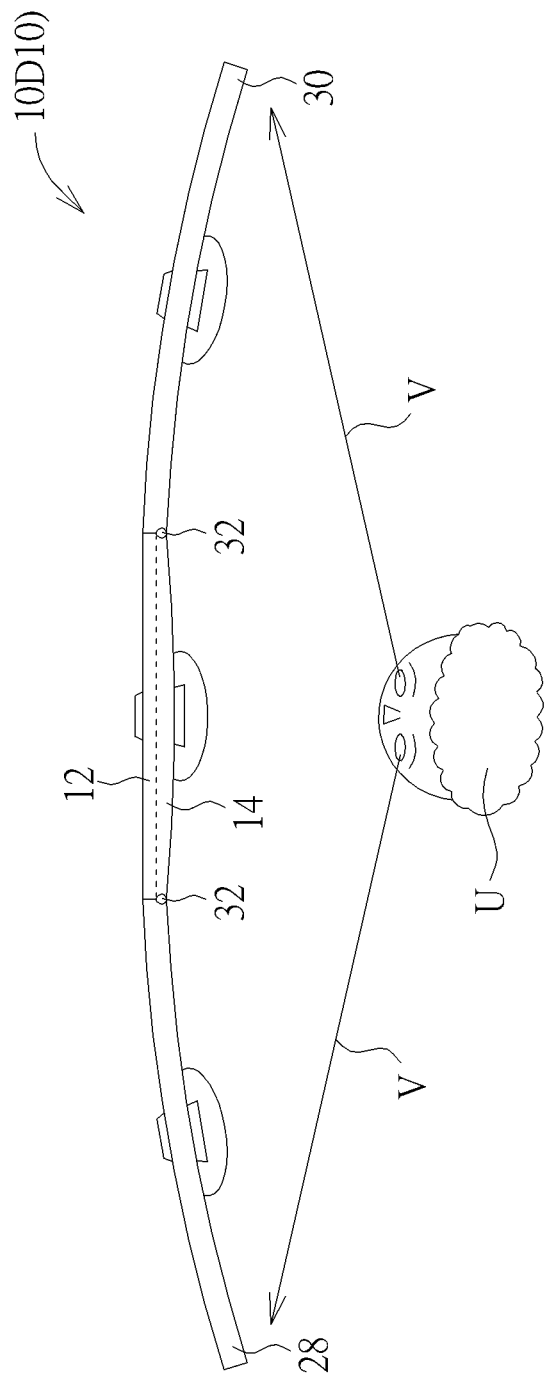
FIG. 10 is a diagram of the image displaying device in another type according to the fourth embodiment of the present invention.

Please refer to FIG. 9 and FIG. 10. FIG. 9 is a diagram of the image displaying device 10D according to a fourth embodiment of the present invention. FIG. 10 is a diagram of the image displaying device 10D in another type according to the fourth embodiment of the present invention. The image displaying device 10D can dispose a first display panel 28 and a second display panel 30 respectively on a left side and a right side of the planar display panel 12. The planar display panel 12 can be the planar display, and the first display panel 28 and the second display panel 30 can be the curved display, which depends on the actual demand; for example, the first display panel 28 and the second display panel 30 may be the planar display. In the fourth embodiment, the light penetrating unit 14 disposed before the planar display panel 12 can be the plane-concave lens or the convex lens, and the plane surface or the convex surface of the light penetrating unit 14 can face toward the planar display panel 12.

When the vision V directly watches the first display panel 28 and the second display panel 30, and passes through the light penetrating unit 14 toward the planar display panel 12, the vision V can acquire that a distance of an imaging position performed by the planar display panel 12 relative to the front of the image displaying device 10D (which may be an outer side of the front frame 18) can be greater than each of two distances of two imaging positions performed by the first display panel 28 and the second display panel 30 respectively relative to the front of the image displaying device 10D, so the image displaying device 10D can show the preferred curved displaying efficiency.

The fourth embodiment can utilize the light penetrating unit 14 (which may be the plane-concave lens or the convex lens) to distort the plane image Ip of the planar display panel 12 via hardware compensation for showing the curved displaying efficiency, instead of software compensation in the foresaid embodiments that analyze and adjust the areas and partitions of the original image Io by the operation processor 16. However, the present invention may simultaneously utilize the hardware compensation and the software compensation to show the preferred curved displaying efficiency in a combination of the planar display and the curved displays.

In the fourth embodiment, difference between a width of the light penetrating unit 14 and a width of the planar display panel 12 can be smaller than a predefined tolerant value, which means the light penetrating unit 14 and the planar display panel 12 can have the same or similar width. An actual value of the predefined tolerant value can be designed in accordance with the size of the image displaying device 10D, and a detailed description is omitted herein for simplicity. As shown in FIG. 9, the first display panel 28 and the second display panel 30 can be respectively connected to the two opposite sides of the planar display panel 12 in the rotatable manner or in the detachable manner; in the embodiment, the first display panel 28 and the second display panel 30 may be disposed on forward position relative to the planar display panel 12 for laterally aligning with the light penetrating unit 14, and the curved displaying efficiency has no fault phenomenon.

Further, as shown in FIG. 10, the first display panel 28 and the second display panel 30 can be respectively connected to two opposite sides of the light penetrating unit 14 in the rotatable manner or in the detachable manner. The embodiment shown in FIG. 10 can avoid the curved displaying efficiency from being affected by the fault phenomenon. The said rotatable application may be the rotary mechanism, the pin mechanism or the movable engagement mechanism; the said detachable application may be the locking mechanism, the buckling mechanism or the magnetic mechanism. Variation of the rotatable application and the detachable application is not limited to the above-mentioned embodiments, which depends on the design demand.

Figure 11:
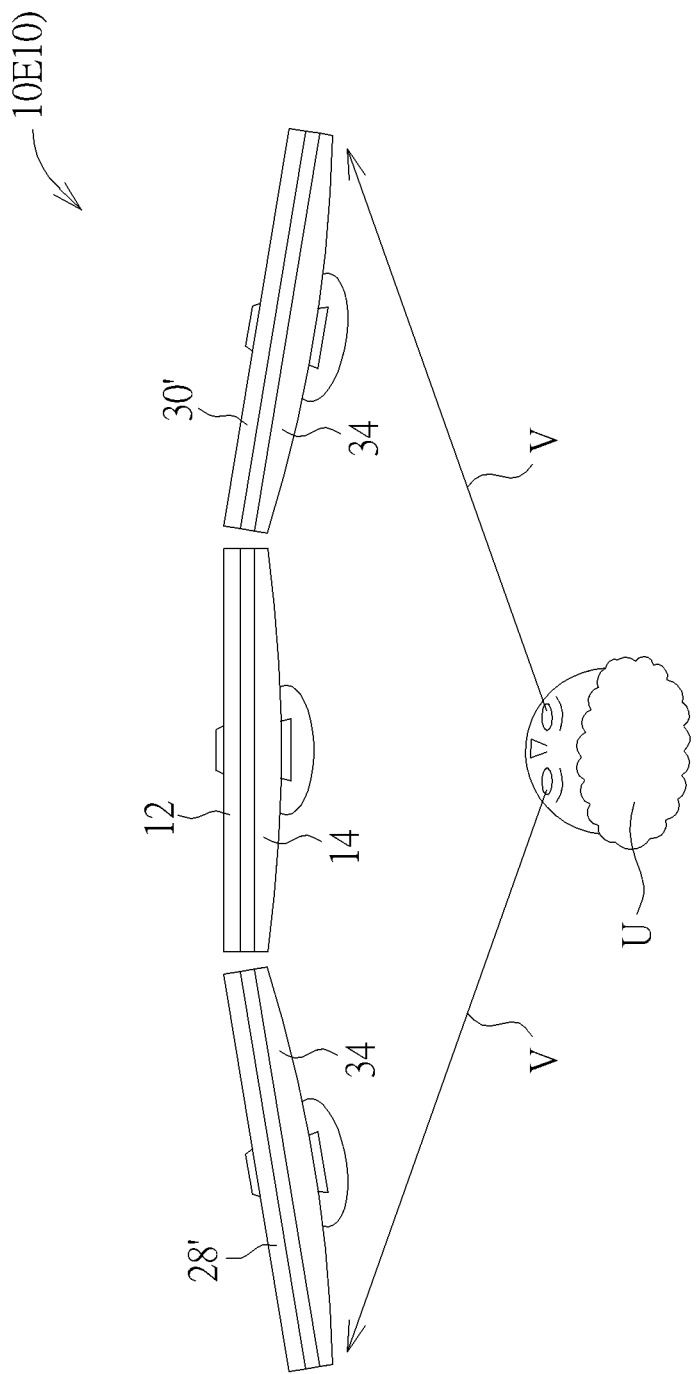
FIG. 11 is a diagram of the image displaying device according to a fifth embodiment of the present invention.

Please refer to FIG. 11. FIG. 11 is a diagram of the image displaying device 10E according to a fifth embodiment of the present invention. The image displaying device 10E can dispose the first display panel 28' and the second display panel 30' respectively on two sides of the planar display panel 12. The image displaying device 10E can include the light penetrating unit 14 and two auxiliary lens units 34. The two auxiliary lens units 34 can be respectively disposed before the first display panel 28' and the second display panel 30', and respectively connected to the two opposite sides of the light penetrating unit 14. The auxiliary lens unit 34 can be the plane-concave lens or the convex lens, and the plane surface or the convex surface of each auxiliary lens unit 34 can face toward the corresponding first display panel 28' or the corresponding second display panel 30'. The auxiliary lens unit 34 may be monolithically integrated with the light penetrating unit 14, and may be an independent unit separated from the light penetrating unit 14 for connecting with the light penetrating unit 14 via adhesion, engagement or other contact manners.

As shown in FIG. 11, the planar display panel 12, the first display panel 28' and the second display panel 30' can be the planar display, and an optical feature of the auxiliary lens unit 34 can be different from the optical feature of the light penetrating unit 14; when the vision V passes through the light penetrating unit 14 toward the planar display panel 12, and passes through the auxiliary lens unit 34 toward the first display panel 28' and the second display panel 30', the vision V can acquire that a distance of an imaging position of the planar display panel 12 relative to the front of the image displaying device 10E is greater than two distances of two imaging positions of the first display panel 28' and the second display panel 30' respectively relative to the front of the image displaying device 10E, so that the image displaying device 10E can show the preferred curved displaying efficiency; that is to say, the focal length of the light penetrating unit 14 can be greater than a focal length of the auxiliary lens unit 34.

Further, if the first display panel 28' and the second display panel 30' are the curved display, the auxiliary lens unit 34 can still be disposed on the front of the curved display, and the related embodiment is not shown in the figures. Any design capable of having the focal length of the auxiliary lens unit 34 smaller than the focal length of the light penetrating unit 14 to show the preferred curved displaying efficiency when the vision V passes through the light penetrating unit 14 and the auxiliary lens unit 34 respectively toward the planar display panel 12 and the first display panel 28' and the second display panel 30' can conform to a design scope of the present invention.

In conclusion, the image displaying device of the present invention can provide several embodiments to show the curved displaying efficiency via the planar display, and have advantages of simple structure and low manufacturing cost. The first embodiment can divide the specific-designed planar display panel into several pixel groups along the specific direction, and the pixel distribution density of one pixel group can be different from the pixel distribution density of other pixel groups. The second embodiment can have the planar display panel with the uniform pixel distribution density, and the specific-designed optical lens module can be disposed before the planar display panel; the optical lens module can have the plurality of lens units, and the central lens group has the longest focal length, and the focal length of other lens groups can be gradually decreased from the center to the side of the plurality of lens units. The third embodiment can utilize the software compensation to adjust all partitions of the plane image via different distortion. The fourth embodiment can dispose the plane-concave lens or the convex lens before the planar display. The fifth embodiment can dispose the plane-concave lens or the convex lens before at least one of the planar display and the curved display.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image displaying device, comprising:
   a planar display panel adapted to display a plane image, the planar display panel at least comprising a first pixel group, a second pixel group and a third pixel group, the second pixel group being located between the first pixel group and the third pixel group; and
   a light penetrating unit disposed before the planar display panel, when vision passes through the light penetrating unit toward the planar display panel, the vision acquiring that a second distance of a second imaging position within the plane image relevant to the second pixel group relative to the planar display panel is greater than a first distance of a first imaging position within the plane image relevant to the first pixel group relative to the planar display panel and a third distance of a third imaging position within the plane image relevant to the third pixel group relative to the planar display panel; wherein
   the light penetrating unit is an optical lens module comprising a plurality of lens units, the plurality of lens units at least comprises a first lens group, a second lens group and a third lens group respectively aligning with the first pixel group, the second pixel group and the third pixel group, a focal length of the second lens group is different from a focal length of the first lens group and a focal length of the third lens group; and wherein the first lens group comprises a plurality of zoomable lens units.

2. The image displaying device of claim 1, wherein the light penetrating unit is a plane-concave lens or a convex lens, and a plane surface or a convex surface of the light penetrating unit faces the planar display panel.

* * * * *